United States Patent
Fischer et al.

(10) Patent No.: US 9,276,382 B2
(45) Date of Patent: Mar. 1, 2016

(54) QUANTUM-SIZE-CONTROLLED PHOTOELECTROCHEMICAL ETCHING OF SEMICONDUCTOR NANOSTRUCTURES

(71) Applicant: Sandia Corporation, Albuquerque, NM (US)

(72) Inventors: Arthur J. Fischer, Albuquerque, NM (US); Jeffrey Y. Tsao, Albuquerque, NM (US); Jonathan J. Wierer, Jr., Albuquerque, NM (US); Xiaoyin Xiao, Albuquerque, NM (US); George T. Wang, Albuquerque, NM (US)

(73) Assignee: Sandia Corporation, Albuquerque, NM (US)

(*) Notice: Subject to any disclaimer, the term of this patent is extended or adjusted under 35 U.S.C. 154(b) by 0 days.

(21) Appl. No.: 14/624,074

(22) Filed: Feb. 17, 2015

(65) Prior Publication Data
US 2015/0270136 A1 Sep. 24, 2015

Related U.S. Application Data

(60) Provisional application No. 61/955,909, filed on Mar. 20, 2014.

(51) Int. Cl.
*H01L 21/302* (2006.01)
*H01S 5/343* (2006.01)
*H01L 33/00* (2010.01)
*B82B 1/00* (2006.01)
*C25F 3/12* (2006.01)
*H01L 21/3063* (2006.01)
*H01L 33/18* (2010.01)

(52) U.S. Cl.
CPC ............ *H01S 5/34333* (2013.01); *B82B 1/00* (2013.01); *C25F 3/12* (2013.01); *H01L 21/30635* (2013.01); *H01L 33/007* (2013.01); *H01L 33/18* (2013.01)

(58) Field of Classification Search
CPC ............ H01L 21/3065; H01L 33/0062; H01L 33/0075; H01L 33/06; H01S 5/34333
USPC .............................. 438/746; 216/37; 252/79.1
See application file for complete search history.

(56) References Cited

U.S. PATENT DOCUMENTS

| | | | | |
|---|---|---|---|---|
| 6,294,475 | B1* | 9/2001 | Schubert | H01L 21/30617 257/E21.221 |
| 2010/0195684 | A1* | 8/2010 | Tamboli | H01L 21/3063 372/44.01 |
| 2015/0129916 | A1* | 5/2015 | Bera | H01L 33/504 257/98 |

OTHER PUBLICATIONS

Leung, Size controlled III-Nitride Quantum Dots, Ph.D. Thesis, (2011), pp. 1-117, University of Michigan.*
Bassam Rasheed, Advances in Materials, (2013) 2(1) pp. 6-11.*

(Continued)

*Primary Examiner* — Duy Deo
*Assistant Examiner* — Maki Angadi
(74) *Attorney, Agent, or Firm* — Kevin W. Bieg

(57) ABSTRACT

Quantum-size-controlled photoelectrochemical (QSC-PEC) etching provides a new route to the precision fabrication of epitaxial semiconductor nanostructures in the sub-10-nm size regime. For example, quantum dots (QDs) can be QSC-PEC-etched from epitaxial InGaN thin films using narrowband laser photoexcitation, and the QD sizes (and hence bandgaps and photoluminescence wavelengths) are determined by the photoexcitation wavelength.

20 Claims, 16 Drawing Sheets

(56) References Cited

OTHER PUBLICATIONS

Matsumoto, H. et al., "Preparation of Monodisperse CdS Nanocrystals by Size Selective Photocorrosion", Journal of Physical Chemistry, 1996, pp. 13781-13785, vol. 100.

Torimoto, T. et al., "Characterization of Ultrasmall CdS Nanoparticles Prepared by the Size-Selective Photoetching Technique", Journal of Physical Chemistry B, 2001, pp. 6838-6845, vol. 105.

Talapin, D.V. et al., "Colloidal Synthesis of Monodisperse Luminescent InP Nanocrystals", Conference Proceedings, 14th Indium Phosphide and Related Materials Conference, 2002, pp. 593-596.

Van Dijken, A. et al., "Size-Selective Photoetching of Nanocrystalline Semiconductor Particles", Chemistry of Materials, 1998, pp. 3513-3522, vol. 10.

Bard, A. J. "Photoelectrochemistry", Science, 1980, pp. 139-144, vol. 207.

Lehmann, V. et al., "Porous Silicon Formation: A Quantum Wire Effect", Applied Physics Letters, 1991, pp. 866-868, vol. 58.

Kolasinski, K. W. "Charge Transfer and Nanostructure Formation During Electroless Etching of Silicon", Journal of Physical Chemistry, 2010, pp. 22098-22105, vol. 114.

Pellegrini, G. et al., "Finite Depth Square Well Model: Applicability and Limitations", Journal of Applied Physics, 2005, pp. 073706-1-073706-8, vol. 97.

Kim, H-M et al., "High-Brightness Light Emitting Diodes Using Dislocation-Free Indium Gallium Nitride/Gallium Nitride Multiquantum-Well Nanorod Arrays", Nano Letters, 2004, pp. 1059-1062, vol. 4.

Lin, H. W. et al., "InGaN/GaN Nanorod Array White Light-Emitting Diode", Applied Physics Letters, 2010, pp. 073101-1-073101-3, vol. 97.

Nguyen, H. P. T. et al., "p-Type Modulation Doped InGaN/GaN Dot-in-a-Wire White-Light-Emitting Diodes Monolithically Grown on Si(111)", Nano Letters, 2011, pp. 1919-1924, vol. 11.

Damilano, B. et al., "Room-Temperature Blue-Green Emission from InGaN/GaN Quantum Dots Made by Strain-Induced Islanding Growth", Applied Physics Letters, 1999, pp. 3751-3753, vol. 75.

Tatebayashi, J. et al., "Strain Compensation Technique in Self-Assembled InAs/GaAs Quantum Dots for Applications to Photonic Devices", Journal of Physics D: Applied Physics, 2009, pp. 1-12, vol. 42.

Minsky M. S. et al., "Room-Temperature Photoenhanced Wet Etching of GaN", Applied Physics Letters, 1996, pp. 1531-1533, vol. 68.

Youtsey, C. et al., "Photoelectrochemical Etching of GaN", Materials Research Society, 1997, pp. 349-354, vol. 468.

Trichas, E. et al., "Resonantly Enchanced Selective Photochemical Etching of GaN", Applied Physics Letters, 2009, pp. 1735051-1-173505-3, vol. 94.

Jung, Y. et al., "Effects of Photoelectrochemical Etching of N-Polar and Ga-Polar Gallium Nitride on Sapphire Substrates", Journal of Electrochemical Society, 2010, pp. H676-H678, vol. 157.

Arakawa, Y. "Progress in GaN-Based Quantum Dots for Optoelectronics Applications", IEEE Journal of Selected Topics in Quantum Electronics, 2002, pp. 823-832, vol. 8.

Moriwaki, O. et al., "Narrow Photoluminescence Peaks from Localized States in InGaN Quantum Dot Structures", Applied Physics Letters, 2000, pp. 236-2363, vol. 76.

Jematsu, T. et al., "Tuning of the Fluorescence Wavelength of CdTe Quantum Dots with 2 nm Resolution by Size-Selective Photoetching", Nanotechnology, 2009, pp. 1-9, vol. 20.

\* cited by examiner

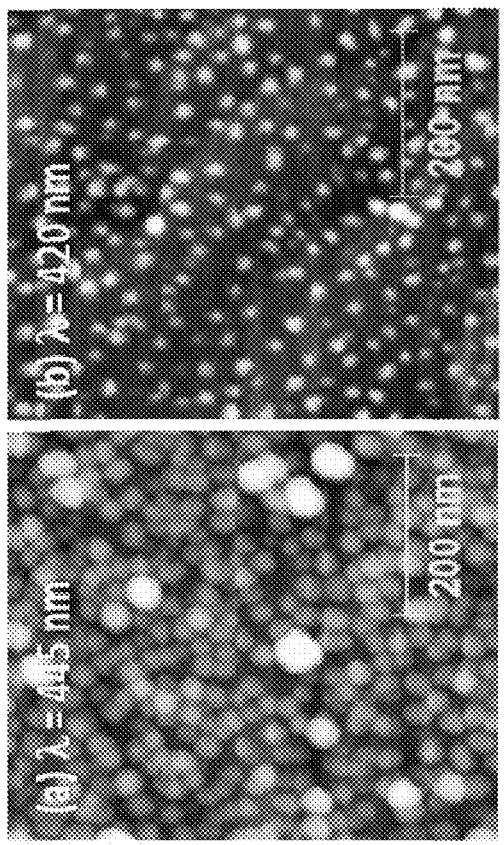
FIG. 3(a)
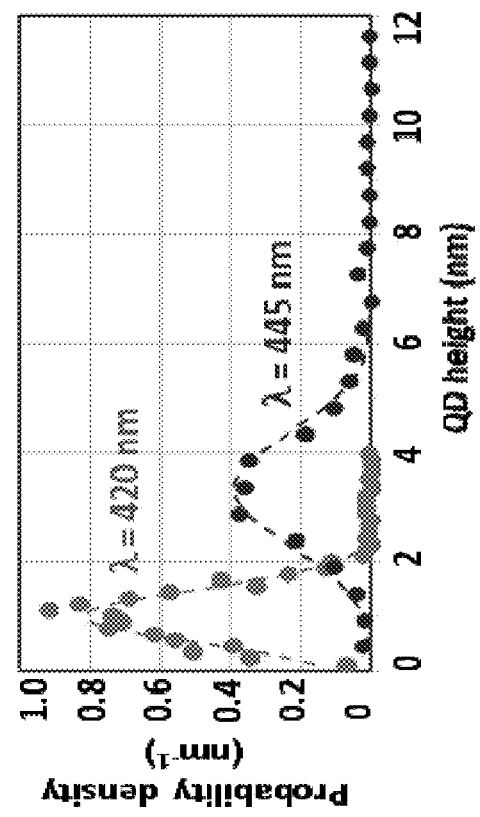
FIG. 3(b)
FIG. 3(c)

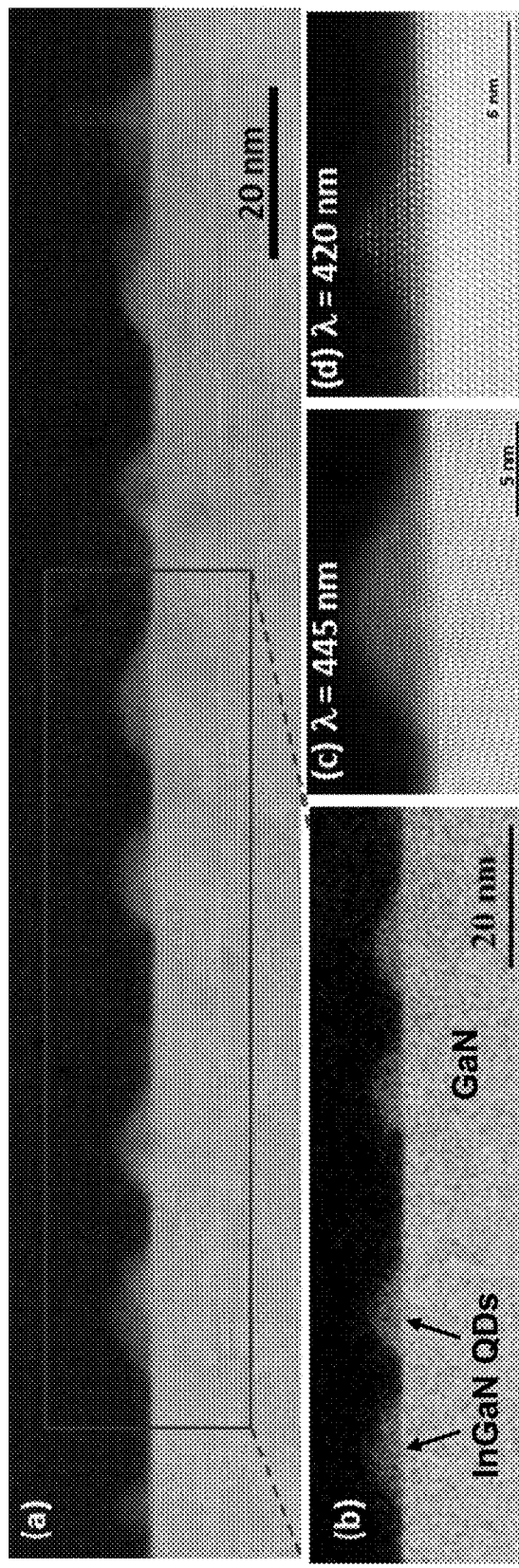

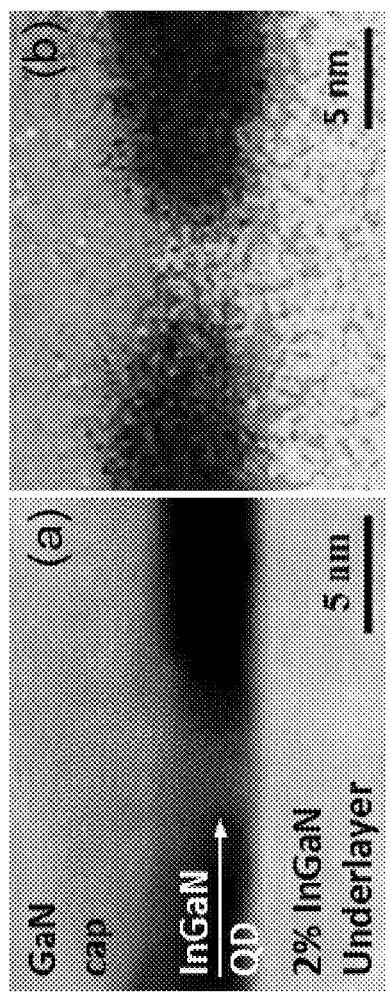
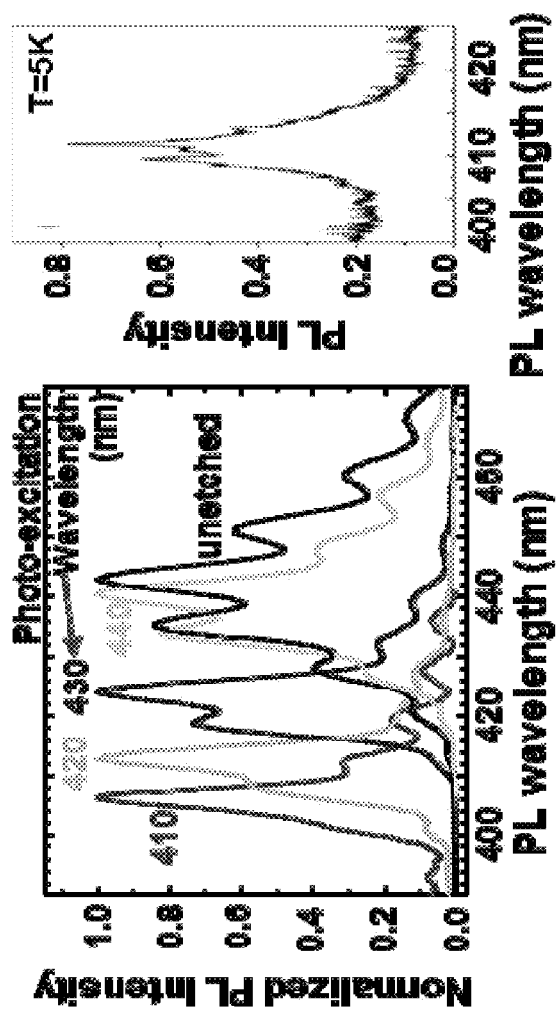
FIG. 5(a)  FIG. 5(b)  FIG. 5(c)  FIG. 5(d)

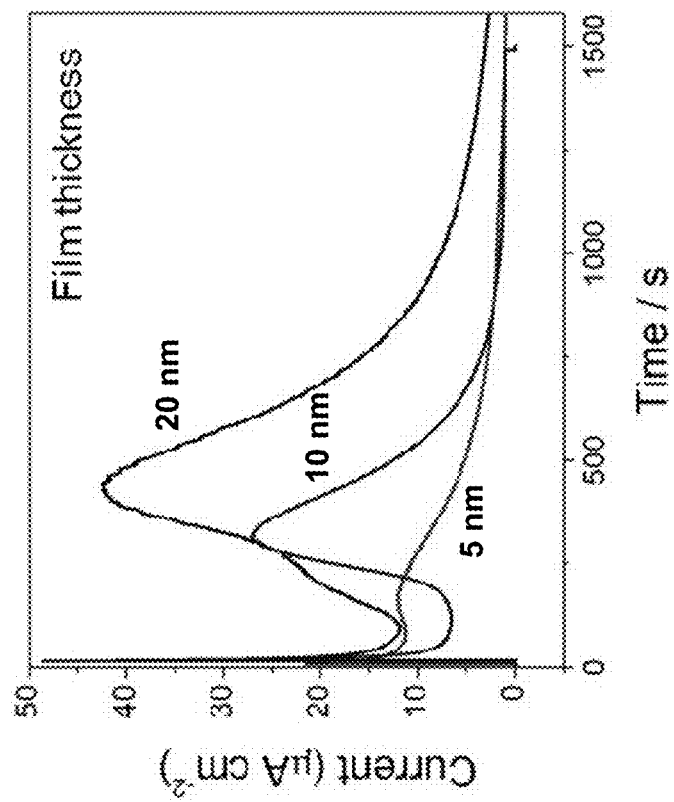
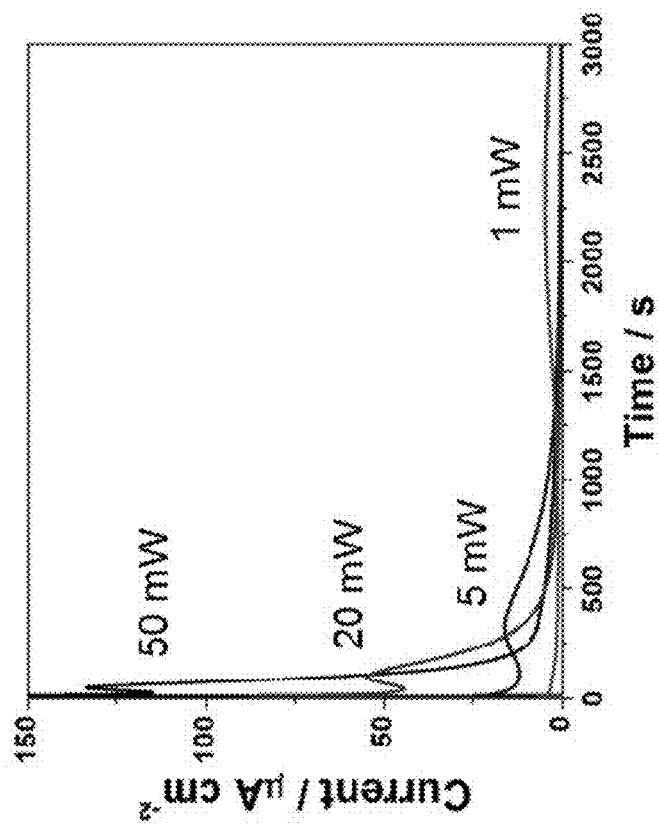
FIG. 12(b)
FIG. 12(a)

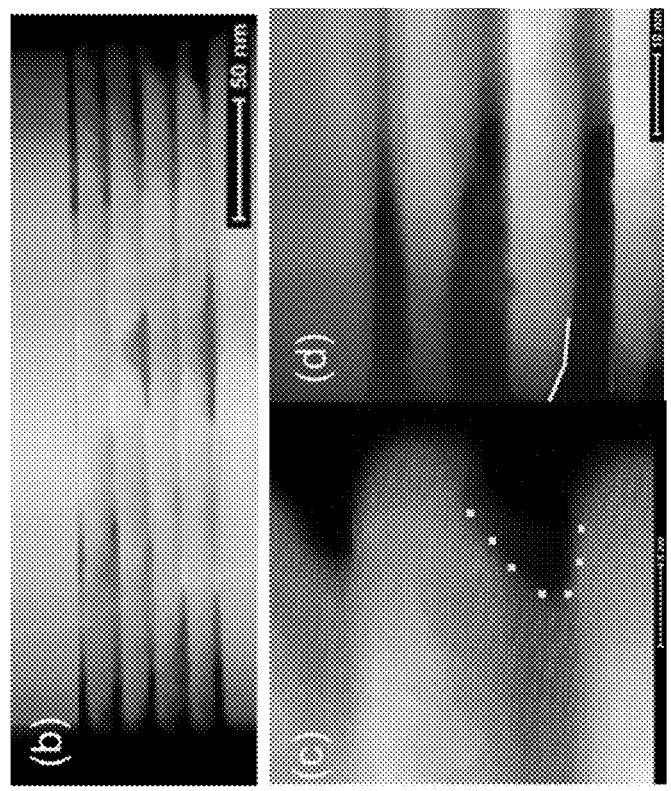
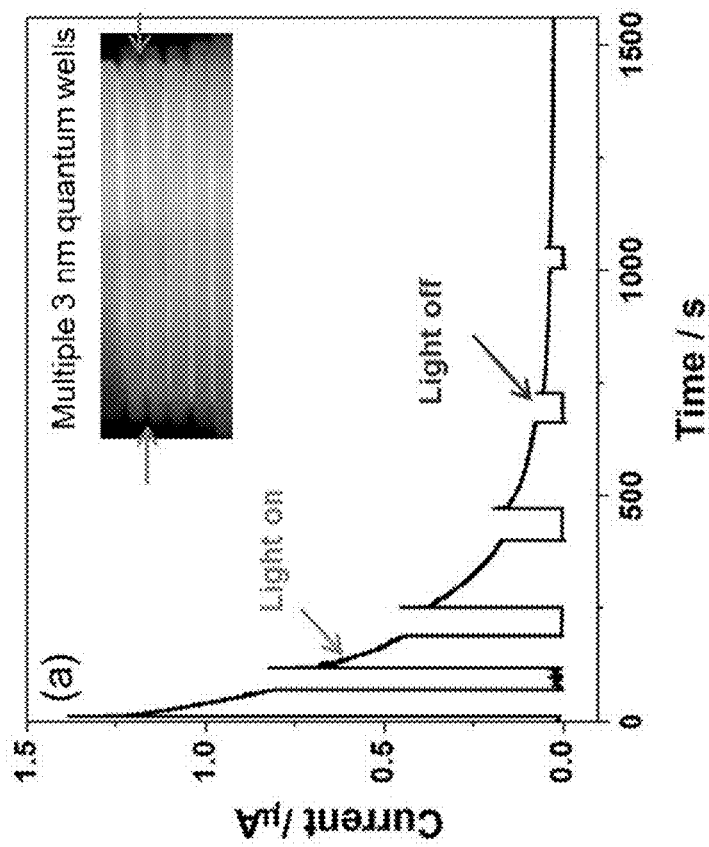
FIG. 15(a)
FIG. 15(b)
FIG. 15(c)
FIG. 15(d)

QUANTUM-SIZE-CONTROLLED PHOTOELECTROCHEMICAL ETCHING OF SEMICONDUCTOR NANOSTRUCTURES

CROSS-REFERENCE TO RELATED APPLICATION

This application claims the benefit of U.S. Provisional Application No. 61/955,909, filed Mar. 20, 2014, which is incorporated herein by reference.

STATEMENT OF GOVERNMENT INTEREST

This invention was made with Government support under contract no. DE-AC04-94AL85000 awarded by the U. S. Department of Energy to Sandia Corporation. The Government has certain rights in the invention.

FIELD OF THE INVENTION

The present invention relates to the fabrication of semiconductor nanostructures and, in particular, to a method for quantum-size-controlled photoelectrochemical etching of semiconductor nanostructures.

BACKGROUND OF THE INVENTION

The past two decades have seen an explosion of interest in semiconductor nanophotonics and nanoelectronics, a large fraction enabled by controlled fabrication of epitaxial semiconductor nanostructures. See S. Kako et al., *Nature Mater.* 5, 887 (2006); K. J. Vahala, *Nature* 424, 839 (2003); and C. Weisbuch and B. Vinter, *Quantum semiconductor structures: Fundamentals and applications*, Elsevier (1991). At the current frontier are nanostructures in the sub-10-nm size regime; however, precise control in that size regime is extremely difficult. Coincidentally, the sub-10-nm size regime is comparable to the exciton Bohr radius in most semiconductors, and thus is also the regime in which semiconductor nanostructures exhibit quantum-size effects. See L. E. Brus, *J. Chem. Phys.* 80, 4403 (1984). If some aspect of a nanofabrication process were sensitive to such quantum-size effects, that process might be used to control nanostructure distribution in size much more precisely than current processes can. In fact, in pioneering work in the 1990's, Yoneyama and others showed that quantum-size effects could be used to size-selectively photo-etch non-epitaxial (colloidal) quantum dots (QDs) in solution. See H. Matsumoto et al., *J. Phys. Chem.* 100, 13781 (1996); T. Torimoto et al., *J. Phys. Chem. B* 105, 6838 (2001); D. V. Talapin et al., *Conference Proceedings, 14th Indium Phosphide and Related Materials Conference* (Cat. No. 02CH37307) 593 (2002); and A. van Dijken et al., *Chem. Mater.* 10, 3513 (1998).

The wide-bandgap III-nitrides are of broad interest in electronics and optoelectronics, many of whose device functionalities would benefit enormously from nanostructures in the quantum-size regime. See S. Nakamura, *Science* 281, 956 (1998); J. M. Phillips et al., *Laser Photonics Rev.* 1, 307 (2007); Y. Taniyasu et al., *Nature* 441, 325 (2006); Y. Arakawa, *IEEE J. Sel. Topics Quantum Electron.* 8, 823 (2002); and M. Zhang et al., *Appl. Phys. Lett.* 98, 221104 (2011). For example, single QDs resonantly coupled to high-Q microcavities would enable high-performance single-photon sources for quantum communications, while monodisperse ensemble QD gain media would enable lower threshold and higher efficiency visible and UV lasers of interest for displays, optical storage, and ultra-efficient and smart solid-state lighting. See S. Kako et al., *Nature Mater.* 5, 887 (2006); and J. J. Wierer et al., *Laser Photonics Rev.* 7, 963 (2013).

III-nitride materials have a combination of properties unique amongst the known semiconductors. See F. A. Ponce and D. P. Bour, *Nature* 386(6623), 351 (1997); Y. Arakawa, *IEEE Journal of Selected Topics in Quantum Electronics* 8(4): p. 823 (2002); T. Saito and Y. Arakawa, *Physica E-Low-Dimensional Systems & Nanostructures* 15(3), 169 (2002); S. N. Mohammad et al., *Proceedings of the Ieee* 83(10), 1306 (1995); M. A. Khan et al., *Solid-State Electronics* 41(10), 1555 (1997); and S. J. Pearton and F. Ren, *Advanced Materials* 12(21), 1571 (2000). Benefiting from advanced epitaxial growth technologies these materials have been widely applied to high power and high speed electronics, solid state lighting, piezoelectric sensors and actuators. However, unlike silicon semiconductors, Ill-nitrides have very high resistivity against wet chemical reactions. Wet chemical etching has only been accomplished at high temperatures with low etching rate, and without selectivity between the composited layer structures. Due to this, dry reactive ion etching has been largely applied to III-nitrides instead of wet chemical etching. See D. Zhuang and J. H. Edgar, *Materials Science &Engineering R-Reports* 48(1), 1 (2005); Y. Jung et al., *Journal of the Electrochemical Society* 159(2), H117 (2012); I. Adesida et al., *Internet Journal of Nitride Semiconductor Research* 4 (1999); I. M. Huygens et al., *Journal of the Electrochemical Society* 147(5), 1797 (2000); F. Karouta et al., *Electrochemical and Solid State Letters* 2(5), 240 (1999); C. B. Vartuli et al., *Journal of the Electrochemical Society* 143(11), 3681 (1996); C. B. Vartuli et al., *Journal of the Electrochemical Society* 143(10), L246 (1996); and C. B. Vartuli et al., *Journal of Vacuum Science & Technology a-Vacuum Surfaces and Films* 14(3), 1011 (1996). Photoelectrochemical etching has recently shown promising as an alternative wet process for gallium nitrides and its alloys. See H. Bae et al., *Japanese Journal of Applied Physics* 52(8), (2013); Y. Gao et al., *Applied Physics Letters* 84(17), 3322 (2004); C. G. Youtsey et al., *Journal of Electronic Materials* 27(4), 282 (1998); R. Oulton, *Nature nanotechnology* 9(3),169 (2014); and I. M. Huygens et al., *Physical Chemistry Chemical Physics* 4(11), 2301 (2002).

However, a need remains for a method to use quantum-size effects to control the fabrication of semiconductor nanostructures and, in particular, the wet chemical etching of III-nitride nanostructures.

SUMMARY OF THE INVENTION

The present invention is directed to quantum-size-controlled photoelectrochemical (QSC-PEC) etching of semiconductor nanostructures. The method comprises providing a semiconductor in a photoelectrochemical cell; illuminating a surface of the semiconductor with narrowband light having energy exceeding the bandgap energy of the epitaxial semiconductor; and photoelectrochemically etching the surface of the semiconductor until a nanostructure forms in the surface that has a quantum-size-dependent bandgap energy greater than the energy of the narrowband light. The semiconductor can comprise an III-V semiconductor, including binary, ternary, and quaternary alloys of group III elements (Ga, Al, and In) and group V elements (P, As, and Sb). The III-V semiconductor can comprise an III-nitride semiconductor, such as InGaN. The narrowband light can have a spectral line width of less than 5 nm and, more preferably, less than 1 nm. The semiconductor can comprise an epitaxial semiconductor film deposited on a substrate having a wider bandgap energy than the bandgap energy of the epitaxial semiconductor film, whereby the photochemical etching occurs on the exposed top surface of the epitaxial semiconductor film. The surface of the semiconductor can be patterned to provide one or more etched mesas or nanowires prior to the step of photoelectrochemically etching the surface of the semiconductor. The surface of the semiconductor can comprise an array of top-down fabricated or bottom-up grown nanowires. The surface of the semiconductor can comprise epitaxially grown or colloidal quantum dots that can be further refined by PEC etching. Alternatively, the semiconductor can comprise a quantum well layer sandwiched between two layers of material having wider bandgap energies than the epitaxial semiconductor film, whereby the photoelectrochemical etching occurs laterally inwards from the sides of the quantum well layer.

QSC-PEC etching enables a novel new class of nanofabrication processes in which quantum-size effects can be used in a self-consistent and self-limited manner to fabricate semiconductor nanostructures on surfaces and in thin films. As an example of the invention, QSC-PEC etching was used to prepare InGaN QDs of controlled size starting from epitaxial InGaN thin films. Photoelectrochemical etching methods can be controlled to significantly enhance the etch rate of III-nitride materials, that is dependent on the laser wavelength, laser power intensity, and electrochemical potential. As the etching proceeds to long times, the InGaN material texture becomes nanostructured, with nanoparticles approaching the quantum size limit. Because the decrease of the particle size results in the decrease of light absorption, due to the decreased volume of the film for light absorption and to the increase of the bandgaps of the resulting nanoparticles due to quantum confinement effects, the etch rate drops to essentially zero due to the self-limiting etch mechanism.

BRIEF DESCRIPTION OF THE DRAWINGS

The detailed description will refer to the following drawings, wherein like elements are referred to by like numbers.

FIG. 1($b$) is a graph showing the quantum dot (QD) diameter dependence of the photoexcitation wavelengths that correspond to the calculated 0 K absorption edge (exciton formation energy) of idealized spherical $In_{0.13}Ga_{0.87}N$ QDs embedded in GaN.

FIGS. 3($a$) and 3($b$) show atomic force microscopy (AFM) images of QDs etched using photoexcitation at λ=445 nm and λ=420 nm, respectively. FIG. 3($c$) is a graph of the probability densities over QD heights inferred from those AFM images: solid circles are AFM measurements and dashed lines are best-fit Gaussian distributions.

FIGS. 4($a$)-4($d$) show scanning transmission electron microscopy (STEM) of QSC-PEC-etched InGaN/GaN structures. FIG. 4($a$) is a high-angle annular dark-field (STEM-HAADF) image of InGaN QDs etched using λ=445 nm photoexcitation. The box shows the region where energy-dispersive x-ray spectroscopy (STEM-EDS) mapping was done, as shown in FIG. 4($b$). FIGS. 4($c$) and 4($d$) are higher resolution STEM-HAADF images of QDs etched using photoexcitation at λ=445 nm and λ=420 nm, respectively, showing the epitaxial nature of the InGaN QDs.

FIGS. 5($a$)-5($d$) are examples of QSC-PEC etching of GaN/InGaN/GaN structures. FIG. 5($a$) is a STEM-HAADF image and FIG. 5($b$) is a STEM-EDS map of QDs etched using 420 nm laser light (dots show $In_{0.13}Ga_{0.87}N$, $In_{0.02}Ga_{0.98}N$, and GaN). The black regions in FIGS. 5($a$) and 5($b$) are the absence of material. FIG. 5($c$) shows micro-photoluminescence (micro-PL) spectra at 5K from ~1 μm$^2$ areas fabricated using laser photoexcitation at the indicated wavelengths, as well as from an unetched sample. The PL FWHM spectral widths from these large ensembles of QDs were (6, 8, 11, 19 nm) for photoexcitation wavelengths (410, 420, 430, 440 nm), respectively, and 25 nm for the unetched sample. The Fabry-Perot fringes in the PL spectra are due to optical thin-film interference effects caused by reflection at the underlying GaN/sapphire interface. FIG. 5($d$) is a micro-PL spectrum at 5K from smaller ensembles of QDs fabricated using a laser photoexcitation wavelength 420 nm on small (150 nm diameter) pre-patterned nanoposts. The spectrum shows both discrete lines indicative of single QDs as well as a broader background indicative of a smaller ensemble of QDs.

FIGS. 12($a$) and 12($b$) are graphs of PEC etching current evolution at a constant potential of 0.9 V. FIG. 12($a$) is a graph of PEC etching of a 10 nm film with variable laser intensity. FIG. 12($b$) is a graph of PEC etching with a 5 mW laser intensity and variable film thickness. Electrolyte: 0.2 M $H_2SO_4$. The laser wavelength was 420 nm.

FIG. 13($b$) shows cross-section profiles of dots across two sections of the etched film. FIG. 13($c$) shows the dot height distribution across the AFM image. The potential cycling was described as in FIG. 11. The inset is a typical AFM image of the film before PEC etching.

FIG. 15($a$) is a graph of PEC current as a function of time during lateral etching of an InGaN/GaN nanowire consisting of multiple 3-nm-thick InGaN quantum wells embedded in GaN layers. Laser light was blocked at five points during the experiment, showing that there is no background dark etch, i.e., in the absence of light. FIG. 15(b) is a STEM image of the progress of lateral etching after 900 s at 0.9 V. FIGS. 15(c) and 15(d) are high resolution STEM images after 300 and 900 s etch, respectively, illustrating the preferential etching of the N-face of the InGaN layer, which faces downward in these epitaxial layers.

DETAILED DESCRIPTION OF THE INVENTION

Figure 1A:
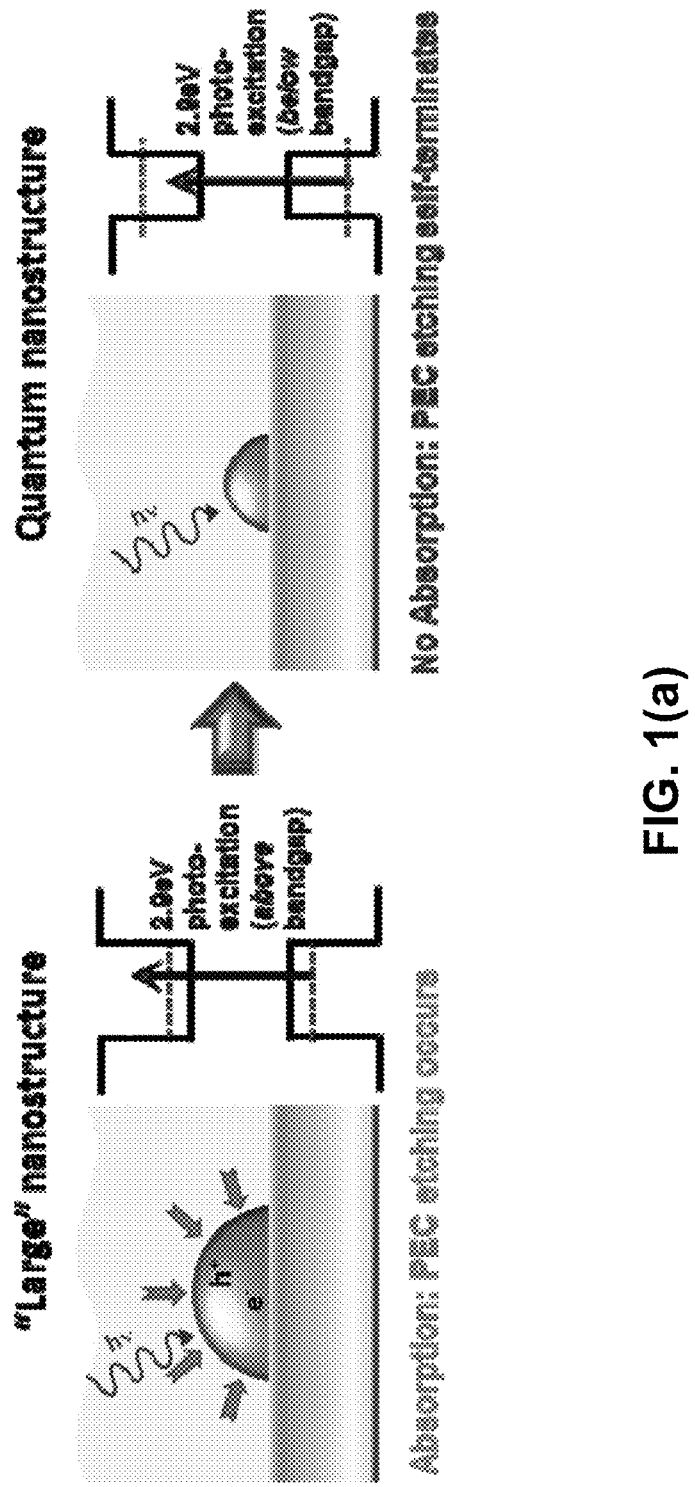
FIG. 1($a$) is a schematic illustration of the quantum-size-controlled (QSC) photoelectrochemical (PEC) etching scheme, showing how quantum-size effects can be used to control PEC etching.

According to the present invention, quantum-size effects are used to control the fabrication of semiconductor nanostructures, with significant implications for the realization of a broad range of future nanoelectronic and nanophotonic devices. The quantum-size-controlled photoelectrochemical (QSC-PEC) etching scheme is illustrated in FIG. 1(a). The initial step in QSC-PEC etching is semiconductor surface oxidization by photoexcited holes. See A. J. Bard, *Science* 207, 139 (1980); and P. A. Kohl, *IBM J. Res. Dev.* 42, 629 (1998). Photoexcitation depends on light absorption; light absorption depends on bandgap; and in the quantum-size regime bandgap depends on nanostructure size. In particular, as the size of a nanostructure gets smaller, the bandgap goes up. Thus, properly selected narrowband light will be absorbed by large but not small nanostructures, and, therefore, PEC etching can be self-terminated at a size determined by the wavelength of that narrowband light. Although quantum mechanical effects have been observed in earlier work on silicon etching that resulted in quantum wires, the effects were not self-limiting in nature as in the present invention. See V. Lehmann and U. Gosele, *Applied Physics Letters* 58(8), 856 (1991); and K. W. Kolasinski, *Journal of Physical Chemistry C* 114(50), 22098 (2010).

Figure 1B:
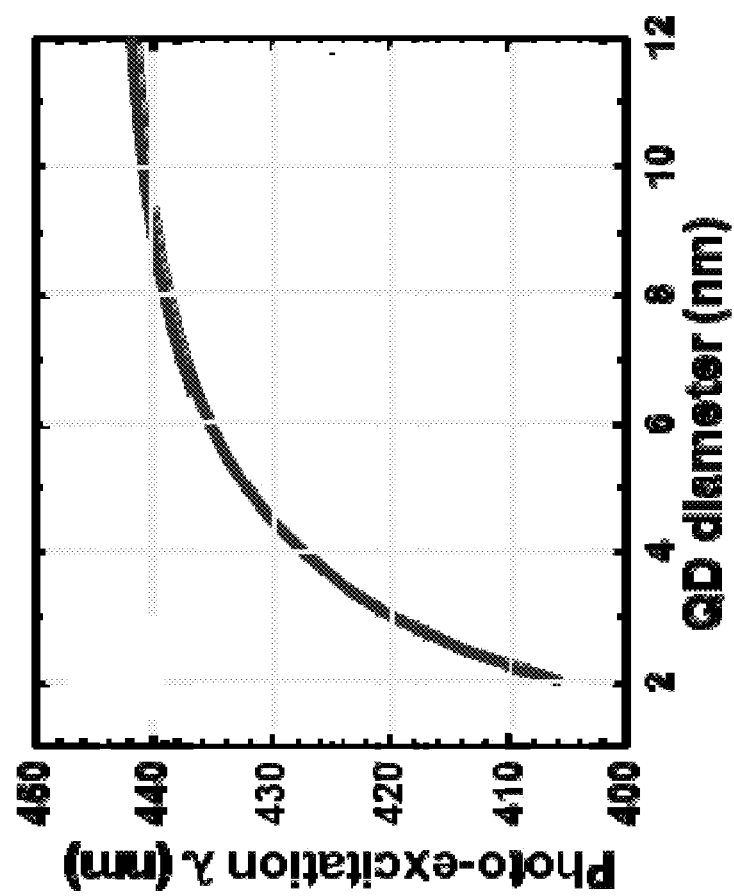

The sensitivity of nanostructure size to that wavelength and, therefore, the precision that can be achieved is illustrated in FIG. 1(b). This graph shows the photoexcitation wavelength corresponding to the calculated 0 K absorption edge of an $In_{0.13}Ga_{0.87}N$ quantum dot (QD) as a function of its diameter. See G. Pellegrini et al., *J. Appl. Phys.* 97, 073706 (2005). In the wavelength range 420-430 nm, a change in photoexcitation wavelength of 1 nm corresponds to a change in QD diameter of approximately 0.1 nm. In other words, though the nanofabrication process uses light, its resolution is not determined by the spatial imaging resolution (hence by the shortness of the optical wavelength) of the optical source, as is usually the case in lithography. Instead, it is determined to first order by the spectral line width of the optical source (which can be quite narrow) convolved with the homogeneous absorption line widths of the QDs themselves (assuming the PEC etch rate of each QD depends only on its own absorption and thus terminates when it itself stops absorbing, independent of the etch progress of the other QDs). Note, though, that homogeneous absorption line widths of QDs, particularly in InGaN materials, are complicated by many factors, including point/line/surface defects, size/shape/strain dependent polarization fields, and Urbach tails.

The QSC-PEC method is quite versatile and can be used to create nanostructures from a variety of semiconductor surfaces, including from planar epitaxial semiconductor thin films. Alternatively, the method can be used to further refine the structure of pre-existing nanostructures, such as nanowires fabricated by patterned top-down etching or by bottom-up growth techniques, or to improve the size distribution of epitaxially grown or colloidal quantum dots. See U.S. Pat. No. 8,895,337 to Wang et al; H.-M. Kim et al., *Nano Lett.* 4, 1059 (2004); H. W. Lin et al., *Appl. Phys. Lett.* 97, 073101 (2010); H. P. T. Nguyen et al., *Nano Lett.* 11, 1919 (2011); B. Damilano et al., *Appl. Phys. Lett.* 75, 3751 (1999); J Tatebayashi et al., *J. Phys. D: Appl. Phys.* 42, 073002 (2009); H. Matsumoto et al., *J. Phys. Chem.* 100, 13781 (1996); T. Torimoto et al., *J. Phys. Chem. B* 105, 6838 (2001); and A. van Dijken et al., *Chem. Mater.* 10, 3513 (1998). Therefore, a pre-existing nanostructure can be patterned at a predetermined location on the surface prior to refinement by QSC-PEC etching. For example, by selecting the proper geometry (e.g., a 150 nm post) QSC-PEC etching can leave a single QD accurately positioned (e.g., to an accuracy of 25 nm or less) at the center of the post. QSC-PEC fabrication of nanostructures is also widely applicable to (Ga, Al, In)—(P, As, Sb) semiconductor alloys, including the AlGaAs and AlInGaP systems. More preferably, the method can be applied to the III-nitride system, including the InGaN system. The wavelength of the narrowband light used to create or refine the nanostructures will depend on the the III-V system used and the size of the PEC-etched nanostructure desired, and can range from about 200 nm to about 7 μm. For example, RGB LEDs can use 610, 540, and 460 nm light to create red, green, and blue quantum dot phosphors from InGaN semiconductors.

QSC-PEC Etching of an Exemplary Epitaxial InGaN Thin Film

As an example of the invention, QSC-PEC etching was used to prepare InGaN QDs of controlled size starting from epitaxial InGaN thin films. The initial set of samples consisted of thin (3-20 nm) epitaxial $In_{0.13}Ga_{0.87}N$ films grown on c-plane GaN/sapphire under conditions similar to those used for state-of-the-art InGaN light-emitting diodes. See D. D. Koleske et al., *Appl. Phys. Lett.* 81, 1940 (2002). The samples had metallic In electrodes applied to the underlying GaN and were then suspended in a PEC cell for etching. For the PEC etching itself, earlier work was followed, except in two respects. First, for the working electrolyte an $H_2SO_4$ aqueous solution was used rather than the more common KOH aqueous solution, which eliminated etching in the absence of light. See M. S. Minsky et al., *Appl. Phys. Lett.* 68, 1531 (1996); and C. Youtsey et al., "Photoelectrochemical etching of GaN," in *Gallium Nitride and Related Materials II*, Materials Research Society, Vol. 468, pp 349-354 (1997). Second, a tunable, relatively narrow-band (~1 nm line width) laser source was used for photoexcitation, following recent reports that such a source enables PEC etch sensitivity to fine absorption features. See E. Trichas et al., *Appl. Phys. Lett.* 94, 173505 (2009).

To elucidate the electrochemistry during PEC etching, the current and charge collection dynamics were measured over a PEC etching life cycle at a photoexcitation wavelength of 420 nm. The current-density vs. time (j-t) curve shown in FIG. 2 follows a characteristic pattern: first, a ~100 s incubation time; second, a steady increase culminating in a sharp peak; and, third, a decay, initially quick but with a long tail. As will be described more fully below, the mechanisms at play during this life cycle, inferred from atomic force microscopy (AFM) snapshots in time, appear to include the following. First, the initial rate is low due to the known resistance of the Ga-terminated (0001) top surface against etching. See Y. Jung et al., *J. Electrochem. Soc.* 157, H676 (2010). Intermediate products which could catalyze dark reactions are not formed, as the dark etch rate in the absence of photoexcitation (the "off" portions of the etch-rate curve in FIG. 2) is negligible throughout the life cycle. Second, the rate increases steadily as etching proceeds nonuniformly and more surface area is exposed (some which is non-(0001) oriented and etches at a faster rate). Third, the etch rate ultimately peaks then decays due to a reduction in the volume of absorbing InGaN, a decrease in the remaining InGaN surface area, and a decrease in light absorption due to the increase in bandgap of the InGaN nanostructures.

Figure 2:
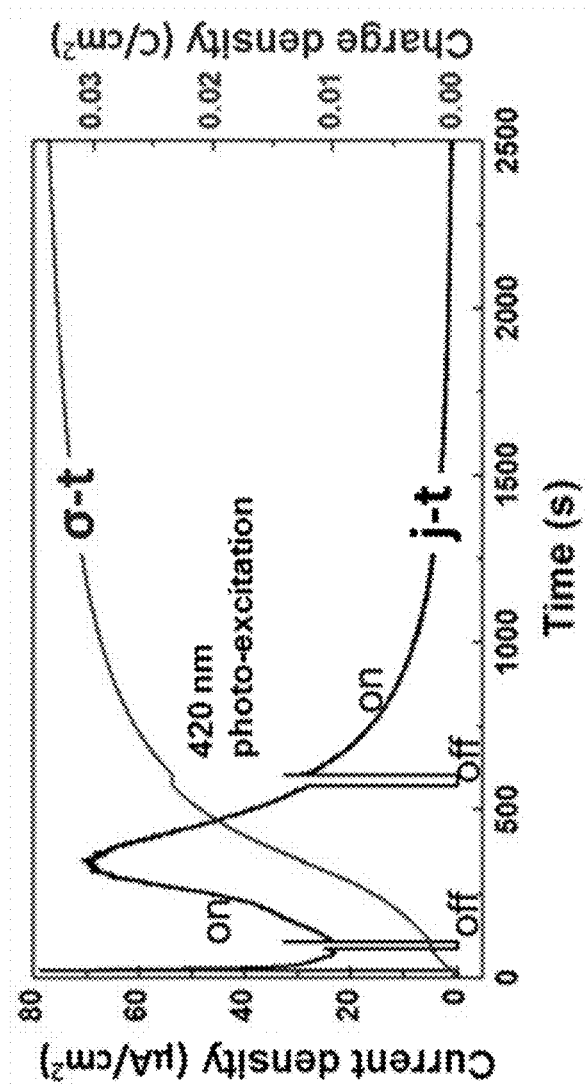
FIG. 2 is a graph of PEC etching of exemplary InGaN/GaN structures. The graph shows current-density vs. time (j-t) and charge-density vs. time (σ-t) dynamics over a PEC etching life cycle (potential fixed at 0.9 V) of an epitaxial $In_{0.13}Ga_{0.87}N$ thin film using λ=420 nm photo-excitation. The current density goes to zero when the laser photoexcitation is turned off at 100 and 600 s, indicating a zero dark etch rate.

For the conditions of FIG. 2, the cumulative charge σ collected asymptotes to that corresponding to etching of ~91% of the InGaN thin film (assuming the number of electrons transferred per unit $In_{0.13}Ga_{0.87}N$ is 3, consistent with the half-reaction $3h^+ + GaN \rightarrow Ga^{3+} + (\frac{1}{2})N_2$ in which the oxidation state of N is increased from −3 to 0 at the anode), indicating that some unetched InGaN remains. To assess this unetched InGaN, AFM measurements were performed at the end of two PEC etching life cycles, one for a photoexcitation wavelength of 445 nm and one for a higher-energy photoexcitation wavelength of 420 nm (the conditions of FIG. 2). That remaining InGaN, as seen in the AFM images in FIGS. 3(a) and 3(b), is typically composed of two superposed distributions of nanodots.

The first distribution is sparse (~15-30 μm$^{-2}$) and composed of larger (~4-10 nm high) dots. These large nanodots are $In_{0.13}Ga_{0.87}N$, as confirmed by scanning transmission electron microscope (STEM) energy-dispersive x-ray spectroscopy (EDS) mapping, and persist even for laser excitation at wavelengths so short (405 nm) that the thick GaN underlayer itself begins to PEC etch. These large nanodots likely coincide with surface-intersecting dislocations or other defects which either repel carriers or at which carrier recombination is extremely fast and PEC etching relatively slower. See C. Youtsey et al., *Appl. Phys. Lett.* 73, 797 (1998).

The second distribution is dense (~1100 μm$^{-2}$) and composed of smaller QDs located randomly at both terraces and step edges. These small QDs are also $In_{013}Ga_{0.87}N$, and are quite sensitive to PEC etching conditions. As illustrated in FIG. 3(c), at a laser excitation wavelength of 445 nm, the best-fit Gaussian QD height distribution is centered at 3.3 nm with a FWHM of 2.4 nm, while at a laser excitation wavelength of 420 nm, the best-fit Gaussian QD height distribution is centered at 1.0 nm with a FWHM of 1.1 nm. Note that the shift in the height distributions, larger QDs for laser excitation at 445 nm and smaller QDs for laser excitation at 420 nm, is qualitatively consistent with the quantum-size-controlled bandedge shift shown in FIGS. 1(a) and 1(b) for $In_{0.13}Ga_{0.87}N$ with bulk bandedge at 450 nm. However, it differs quantitatively, likely because these QDs are not spherical, but are flattened laterally (as seen below in FIGS. 4(a)-4(d)).

To assess at a higher level of detail the second distribution of small QDs, cross-sections of these QDs were imaged using high-angle annular dark-field aberration-corrected cross-sectional scanning transmission electron microscopy (STEM-HAADF). An ensemble of eight similarly sized QDs is shown in FIG. 4(a). An energy-dispersive x-ray spectroscopy (STEM-EDS) map of a smaller ensemble of four QDs is shown in FIG. 4(b), verifying that the QDs are indeed $In_{0.13}Ga_{0.87}N$. Atomically resolved STEM-HAADF images of QDs PEC etched at photoexcitation wavelengths of 445 nm and 420 nm are shown in FIGS. 4(c) and 4(d), respectively. These atomically resolved images show that the $In_{0.13}Ga_{0.87}N$ QDs are epitaxial to the underlying GaN. They appear to be unfaceted, unlike InGaN QDs formed by growth, but it is possible that crystallographic dependencies would be observed under closer examination or for other PEC etch conditions. See Y. Gao et al., *Appl. Phys. Lett.* 84, 3322 (2004). Most importantly, they decrease in size with decreasing photoexcitation wavelength, consistent with the quantum-size-controlled nature of the PEC etch.

Photoluminescence (PL) intensities measured from these QDs were relatively weak, however, perhaps due to the unpassivated surfaces and the lack of a low-In-content InGaN underlayer whose presence is well known to improve radiative efficiency. See T. Akasaka et al., *Appl. Phys. Lett.* 85, 3089 (2004). To improve the PL intensities, another set of samples was prepared, similar to the samples described above except with a low-In-content $In_{0.02}Ga_{0.98}N$ epitaxial underlayer beneath, and a thin (10 nm) epitaxial GaN cap on top of the now-buried $In_{0.13}Ga_{0.87}N$ layer. The thin GaN cap was somewhat permeable to the PEC etch, etching in localized spots and exposing the underlying $In_{0.13}Ga_{0.87}N$. The $In_{0.13}Ga_{0.87}N$ was then laterally etched underneath the GaN to create buried $In_{0.13}Ga_{0.87}N$ QDs with bottom and top surfaces passivated by $In_{0.02}Ga_{0.98}N$ and GaN, respectively. Except for an additional incubation period, PEC etching to form buried QDs appears to be similar to PEC etching to form the surface QDs of FIGS. 2, 3 and 4. STEM and STEM-EDS images of one such buried QD are shown in FIGS. 5(a) and 5(b), showing that it is indeed epitaxial with the underlying $In_{0.02}Ga_{0.98}N$ and overlying GaN. Though not fully passivated, these samples do exhibit much (~100×) higher PL intensities (FIGS. 5(c) and (d)) than the samples shown in FIG. 4.

FIG. 5(c) shows a low-temperature micro-PL from a ~1 μm$^2$ region containing an ensemble of the order of 10$^3$ QDs. The PL spectra blue shift (from 440 to 405 nm) with decreasing PEC photoexcitation wavelength (from 440 to 410 nm) is consistent with a controlled, tunable decrease in effective QD diameter (from ~9 to ~2.5 nm) and too much to be associated with other possible explanations, such as elastic strain relaxation. The PL spectra also narrow (from $\Delta\lambda_{FWHM}$~19 to 6 nm), consistent with a narrowing of the QD size distribution. The narrowest observed PL line width ($\Delta\lambda_{FWHM}$~6 nm) and implied distribution of QD sizes is much narrower than both those typical for conventional Stranski-Krastanov grown epitaxial InGaN QD ensembles ($\Delta\lambda_{FWHM}$~30-40 nm) and those for size-selective photoetching of non-epitaxial (colloidal) II-VI QDs ($\Delta\lambda_{FWHM}$~23.5 nm). See Y. Arakawa, *IEEE J. Sel. Topics Quantum Electron.* 8, 823 (2002); O. Moriwaki et al., *Appl. Phys. Lett.* 76, 2361 (2000); and T. Uematsu et al., *Nanotechnoloqy* 20, 215302 (2009). However, they are not narrower than those observed for tightly lithographically controlled selective-area-epitaxial InGaAs QDs. See A. Mohan et al., *Small* 6, 1268 (2010). The present invention does not require such tight lithographic control.

FIG. 5(d) shows low-temperature micro PL from a much smaller ensemble of the order of 10's of QDs. This ensemble was created by pre-patterning (e-beam lithography and reactive ion etching) the sample into 150 nm diameter nanoposts before PEC etching (at 420 nm), and thus is composed of a dramatically reduced number of QDs on top and near the center of the nanoposts. Micro-PL measurements using a 1 μm diameter pump spot centered on one post show emission from single QDs. FIG. 5(d) shows these as sharp, resolution-limited ($\Delta\lambda_{FWHM}$<0.3 nm) spikes at 5K, spikes which disappear as the temperature is increased to ~50K. Though these spikes appear on a broader background from a smaller ensemble of QDs on one nanopost, as described more fully below, QSC-PEC etching can be used to fabricate both single or arrayed QDs within single or arrayed nanoposts or nanowires, thereby achieving simultaneous precise spatial and spectral matching of QDs to optical cavities within a nanophotonic structure. See R. Oulton, *Nature Nanotech.* 9, 169 (2014).

Detailed Characterization of QSC-PEC Etching

The nanofabrication process depends on surface electrochemistry, light absorption, carrier recombination and transport, subsequent passivation of exposed surfaces, and on the semiconductor material itself. As an example, the characteristics of photoelectrochemical etching of epitaxial InGaN semiconductor thin films using narrowband lasers with linewidth less than ~1 nm was examined in detail. A narrowband (~1 nm linewidth) tunable laser was used rather than broadband sources most often used in literature to provide accurate and controlled energies for photoexcitation, and simple thin-film geometries were used for ease of interpretation. Laser-induced PEC etching of thin InGaN films was characterized as a function of laser wavelength and intensity, as a function of film thickness and geometry, and dynamically across the overall InGaN thin film PEC etching life cycle. As will be described more fully below, in the initial stages of PEC etching, when the thin film is flat, characteristic voltammogram shapes are observed. At low photoexcitation rates, voltammograms are S-shaped, indicating the onset of a voltage-independent rate-limiting process associated with electron-hole-pair creation and/or annihilation. At high photoexcitation rates, voltammograms are superlinear in shape, indicating, for the voltage ranges described herein, a voltage-dependent rate-limiting process associated with surface electrochemical oxidation. As PEC etching proceeds, the thin film becomes rough at the nanoscale, and ultimately the self-limiting etch kinetics leads to an ensemble of nanoparticles. This change in InGaN film volume and morphology leads to a characteristic dependence of PEC etch rate on time: an incubation time, followed by a rise, then a peak, then a slow decay.

Sample Preparation and Photoelectrochemical Cell

Figure 6:
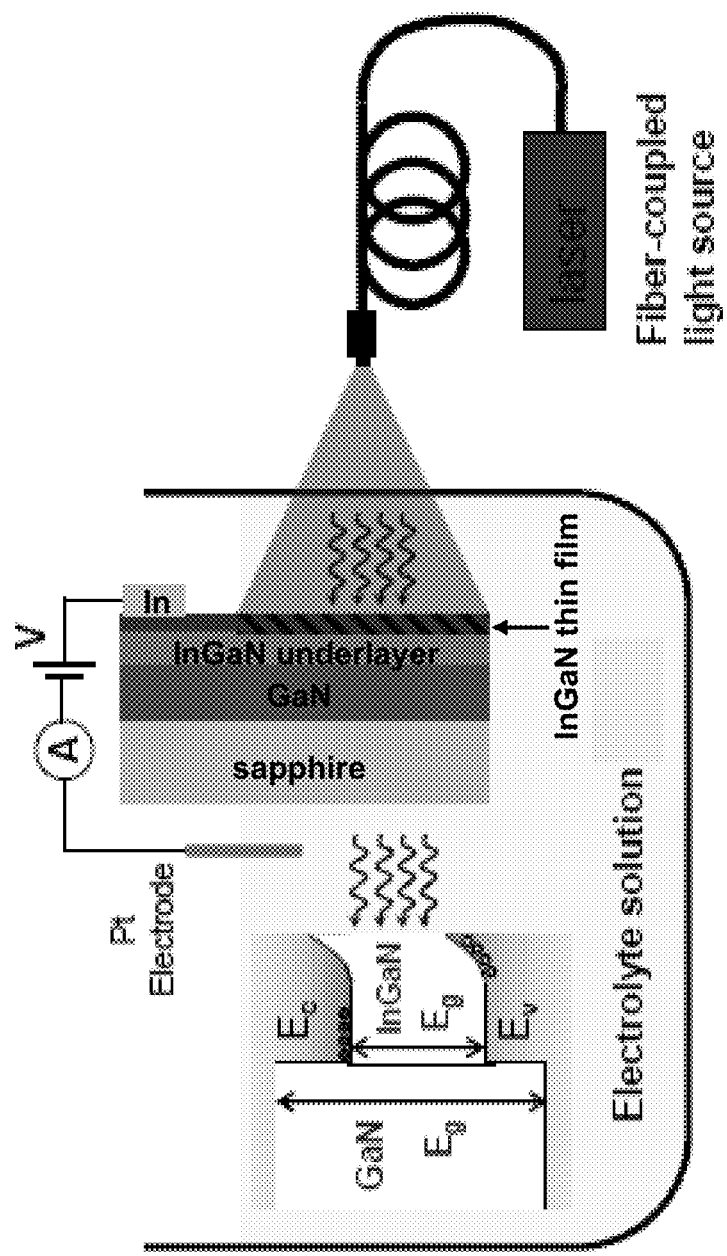
FIG. 6 is a schematic illustration of a photoelectrochemical cell that can be used for QSC-PEC etching.

InGaN and GaN thin films were grown on sapphire templates by metal-organic vapor-phase epitaxy (MOVPE). A thick (4-5 micron) GaN buffer layer was first grown on a sapphire substrate at 1050° C., followed (in some cases) by a 100-nm-thick $In_{0.02}Ga_{0.98}N$ underlayer, followed by a 3 to 20-nm-thick $In_{0.13}Ga_{0.87}N$ film grown at 770° C., finally followed (in some cases) by a 10-nm-thick GaN cap grown at 800° C. A photoelectrochemical cell used for QSC-PEC etching of the epitaxial InGaN thin film is shown in FIG. 6. Metallic indium electrodes applied to the front of the sample by contact with In wire at 280° C. were used as the working electrode. A 0.2M $H_2SO_4$ aqueous solution was used as the working electrolyte rather than the more common KOH aqueous solution, which largely eliminated etching in the absence of light. The second harmonic of a tunable Ti:sapphire laser (400-500 nm wavelength, 2 ps pulse width, 1 nm linewidth, 82 MHz pulse repetition rate, 10 mW) was used for photoexcitation during PEC etching. Light was directed through an optical fiber, then through a quartz window, then through ~1.5 cm of electrolyte, resulting in a ~2 cm diameter Gaussian spot on the sample. The samples were suspended in the PEC cell, with PEC etching performed using an electrochemical analyzer. A Pt counter electrode and an Ag/AgCl reference electrode were used.

Thin Film Microstructure and Optical Absorption

Figure 7:
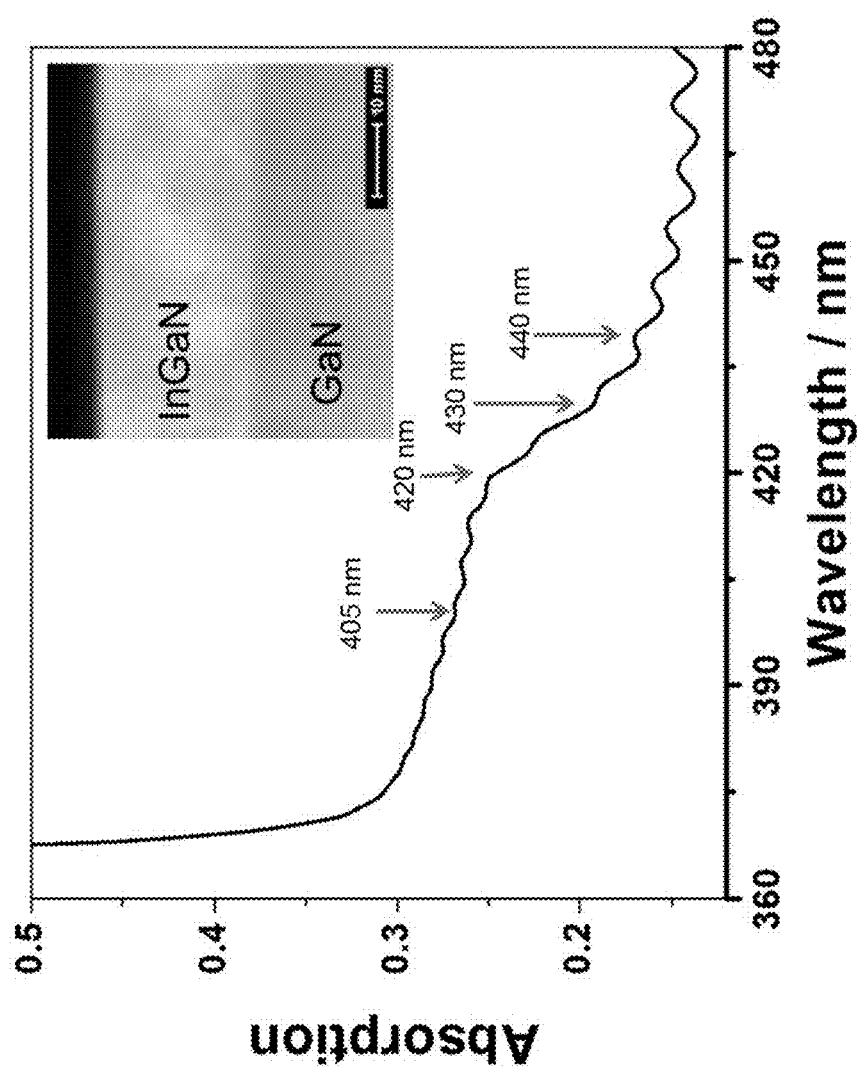
FIG. 7 is an optical absorption spectrum of a 20-nm-thick $In_{0.13}Ga_{0.87}N$ epitaxial film on a 5-μm-thick GaN buffer layer on a sapphire substrate. Insert, cross-section STEM image of the film. The arrows indicate the wavelengths of the lasers used for PEC etching.

The microstructure of the InGaN film, and of its interface with the underlying GaN, is shown in the STEM in the inset to FIG. 7. The InGaN appears brighter than the GaN due to the higher mass of In. EDS mapping showed a uniform distribution of In across the thin film; the In content for the sample was measured to be 13% (i.e., $In_{0.13}Ga_{0.87}N$).

To understand how the degree of photoexcitation changes with laser wavelength and film thickness, optical absorption of the films was examined. FIG. 7 shows the transmission through a typical sample prior to etching: a 20-nm-thick $In_{0.13}Ga_{0.87}N$ epitaxial film on a 5-μm-thick GaN buffer layer, all on a sapphire substrate. The optical absorption observed at wavelengths below 380 nm is due to the thick GaN buffer layer; the optical absorption observed at wavelengths between 380 and 450 nm is due to the thin $In_{0.13}Ga_{0.87}N$ film. The offset beyond the bandgap (below 450 nm) is reflected light; the spectral oscillations are primarily due to thin-film interference effects in the light reflected at the InGaN/air and the GaN/substrate interfaces. The gradual, rather than sharp fall-off in absorption beyond 380 nm is attributed to inhomogeneous broadening from alloy fluctuations and internal piezoelectric fields.

The photoexcitation laser wavelengths of the lasers used in the PEC etching experiments are indicated by the arrows. The absorption coefficient α of the $In_{0.13}Ga_{0.87}N$ film at these wavelengths can be extracted from the reflectance (R) and transmittance (T) from the expression $R+T=\exp(-\alpha h)$, where the film thickness h=20 nm. The absorption coefficient at 420 nm was $~6.4 \times 10^4$ cm$^{-1}$, for example.

Dark Versus Photo-Induced Electrochemistry

Figure 8:
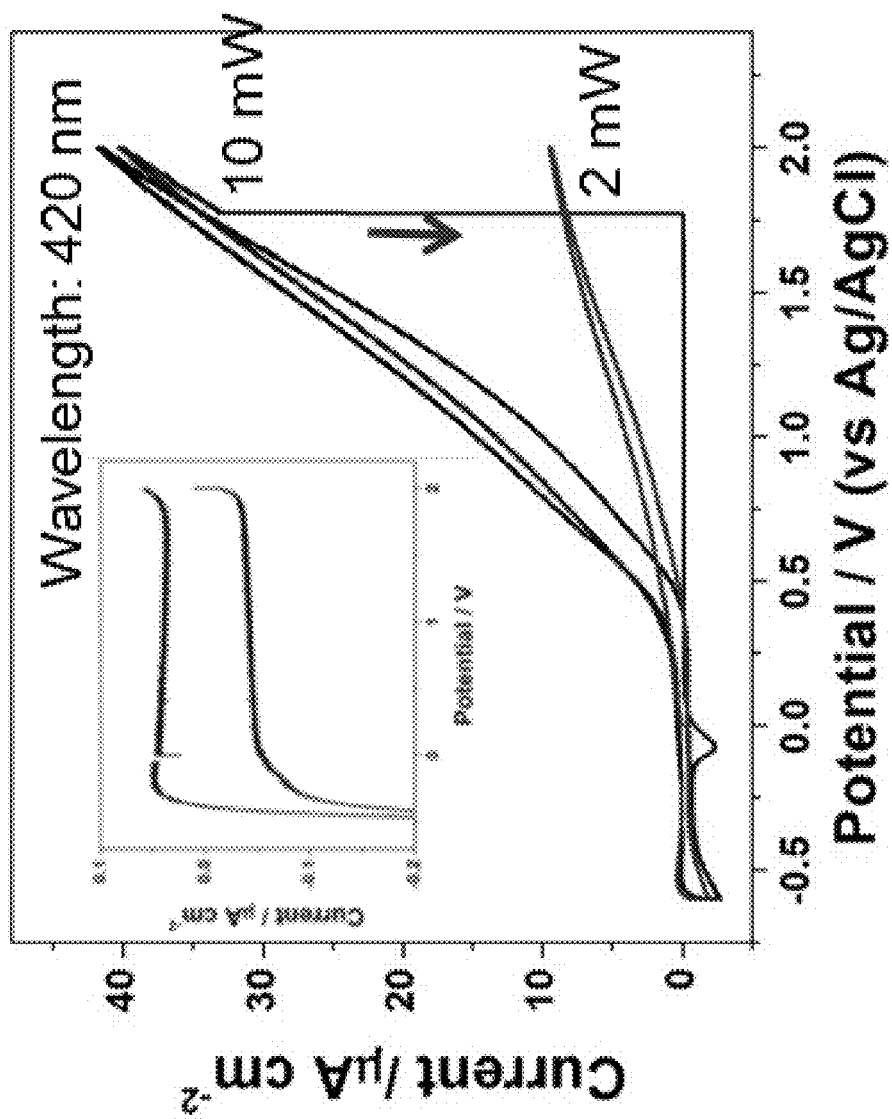
FIG. 8 is a graph showing the dependence of PEC etch dynamics on laser power intensity at 420 nm laser excitation for a 10 nm InGaN epi-film, 0.2 M $H_2SO_4$, 0.2 V/s. The laser intensity is indicated in the figure. The arrow indicates the laser being blocked. The inset was the voltammogram recorded in the dark.

To understand the range of potentials over which no dark electrochemical reaction occurs, the inset to FIG. 8 shows a cyclic voltammogram in the initial stages of PEC etching of the InGaN thin film, in the absence of photoexcitation. It can be seen that there is only a non-Faradaic double layer charge-discharge current in the range from ~−0.2 to 1.6 V. The onset of a Faradaic current at ~1.6 V can be attributed to oxidation of water. The onset of a Faradaic current at ~−0.2 V can be attributed to hydrogen evolution. Thus, the range of potentials over which no dark electrochemistry occurs is relatively large, and the experiments described below stayed within this range.

FIG. 8 shows the voltammograms at two different illumination powers, 2 mW (lower curve) and 10 mW (upper curve), illustrating the strong dependence of the etch current on photo excitation. The vertical trace in the main portion of FIG. 8 shows that, if the light is turned off after PEC etching for some time, the etching current drops precipitously (arrow), and that a small reduction current peak now appears at ~−0.1 V. This dip can be attributed to re-deposition of In from $In^{3+}$ in the solution that was generated during PEC etching.

Initial PEC Etching Kinetics: Dependence on Laser Wavelength and Intensity

Figure 9A:
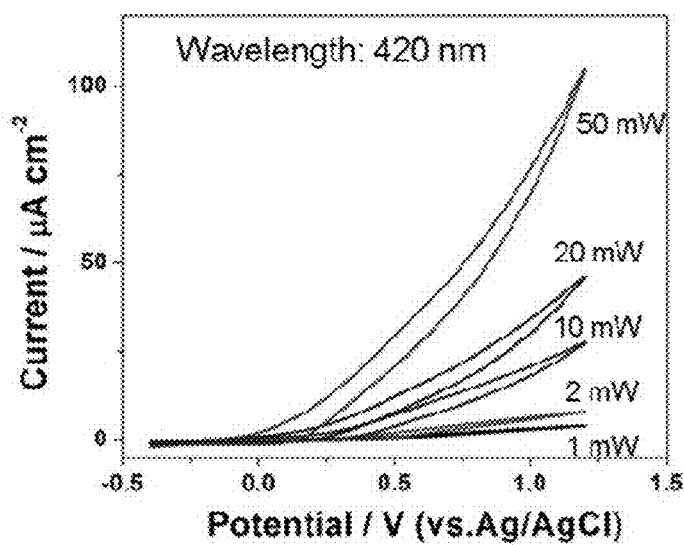
FIGS. 9($a$)-9($c$) show the dependence of PEC etch dynamics on laser wavelength and power intensity for a 10 nm InGaN epi-film, 0.2 M $H_2SO_4$, 0.2 V/s. The laser wavelength and intensity are indicated in the figures, respectively.
Figure 9B:
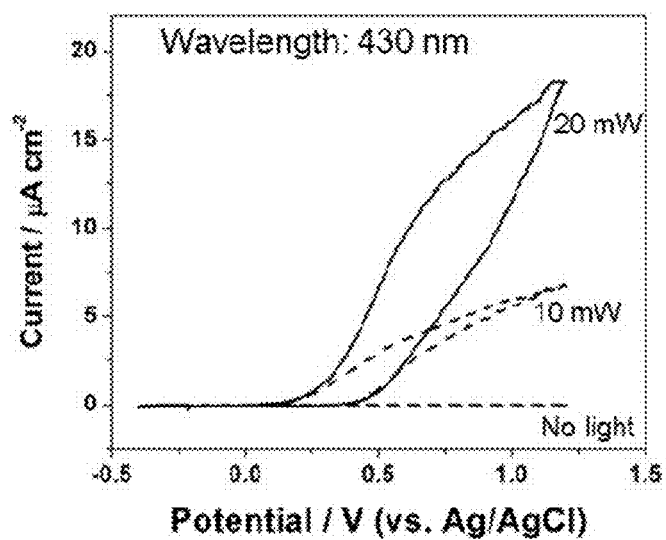
Figure 9C:
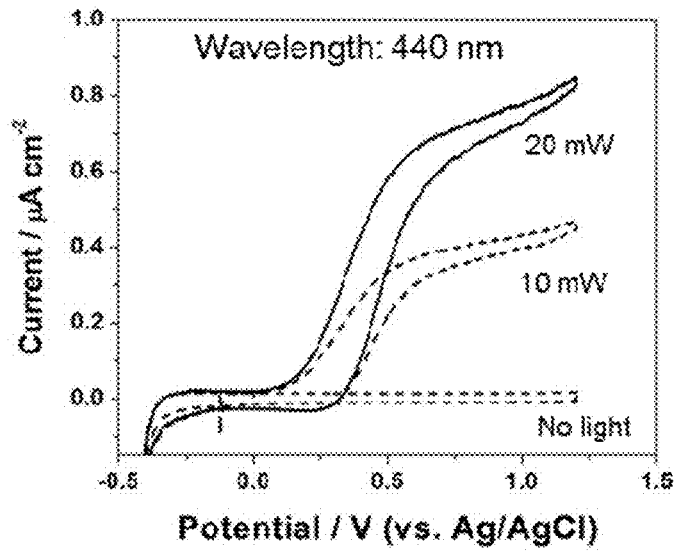

In the presence of photoexcitation, in the initial stages of PEC etching of the InGaN thin film, an anodic current appears at ~0.1 V. As seen in FIGS. 9(*a*)-9(*c*), this current increases with increasing laser intensity and decreasing laser wavelength, consistent with a photoexcited process and with an InGaN absorption coefficient that increases with increasing photon energy above its bandgap. Indeed, the sensitivity to wavelength is very strong, with the axes scales in FIGS. 9(*a*), 9(*b*), and 9(*c*) decreasing by two orders of magnitude as wavelength increases from 420 to 430 to 440 nm. Negligible photocurrent was observed at laser wavelength longer than 450 nm, which is below the InGaN absorption band edge shown in FIG. 7.

The magnitudes of the anodic currents and the shapes of the current-potential voltammograms over the studied voltage range depend on photoexcitation rate. At lower photoexcitation rates, due to either lower laser intensities or reduced absorption at longer laser wavelengths, the voltammograms are S-shaped: increasing rapidly at voltages just beyond 0.1 V, then saturating at voltages significantly beyond 0.1 V. At low voltages, surface oxidation is slow and rate-limiting. As voltage is increased, the rate of surface oxidation increases exponentially until ultimately becoming rate-limited by the photoexcitation, resulting in the observed S shapes.

At higher photoexcitation rates, due either to higher laser intensities or to increased absorption at shorter laser wavelength, the voltammograms (PEC etch rates) increase super linearly with voltage. However, up to the maximum voltage examined the PEC etch rates do not saturate, i.e., the S shape are not observed. The possible effects of mass transport due to laser heating are neglected, since the variation in temperature at such low power intensities is negligible. See M. Lax, *Journal of Applied Physics* 48(9), 3919 (1977).

Figure 10:
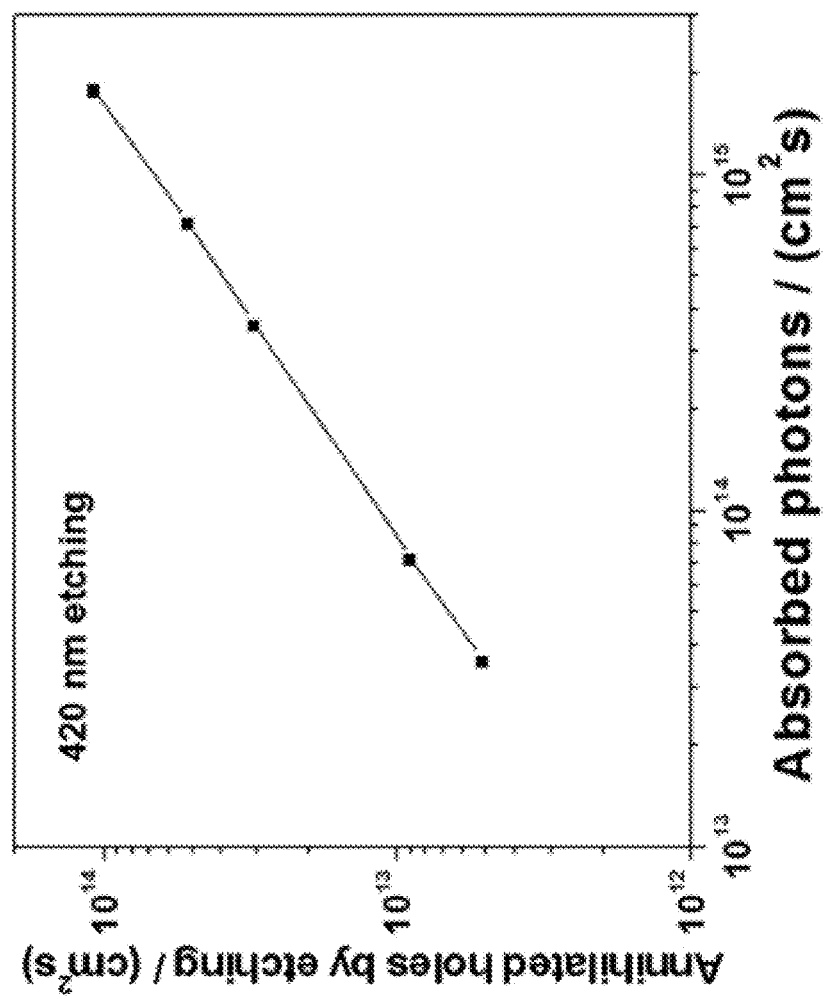
FIG. 10 shows the dependence of PEC etch rate at 0.9 V on photoexcitation rate at Log scales from a 10 nm InGaN film.

The PEC etch rate at 0.9 V (as determined by the etch current from FIG. 8(a)) versus photoexcitation rate (calculated as the product of the incident laser power/time the fraction of light absorbed, as determined by the absorption coefficient from FIG. 7) is shown in FIG. 10. A nearly-linear increase of etch rate with light absorption (i.e., charge-carrier creation) was observed, increasing as the ~0.8 power.

An "etch efficiency" can be defined as the number of electron-holes annihilated by the PEC etching reaction divided by the number of photons absorbed by the film. For the 420 nm laser illumination, this etch efficiency ranged from 14% (1 mW) to 6% (50 mW), which illustrates the sub-linear scaling described above. As the low laser powers used in these experiments, the dominant competing carrier-destruction mechanism is expected to be non-radiative recombination at defects, which should scale linearly with laser power (and, thus, with carrier density). Additional competing non-linear carrier-destruction pathways may account for the slow decrease in etching efficiency with increasing laser power.

Evolution of PEC Etching with Time

The kinetics during the initial stages of PEC etching of the InGaN thin film are described above. As the process proceeds, the etching reaction rate evolves, as illustrated in FIGS. 11 and 12.

Figure 11A:
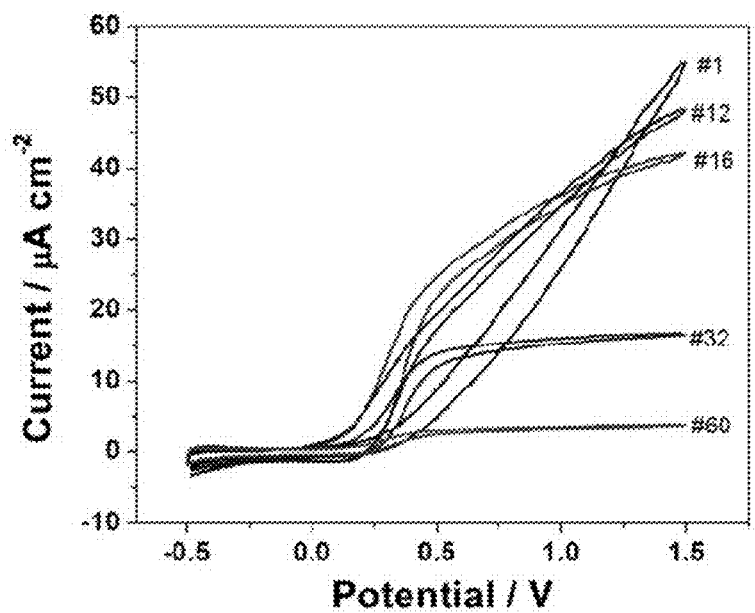
FIGS. 11($a$) and 11($b$) show the etch dynamics during consecutive potential cycling of a 10 nm InGaN epi-film in 0.2 M $H_2SO_4$ at 0.2 V/s. The number of potential cycles with corresponding features was indicated. The laser: 420 nm, ~10 mW.
Figure 11B:
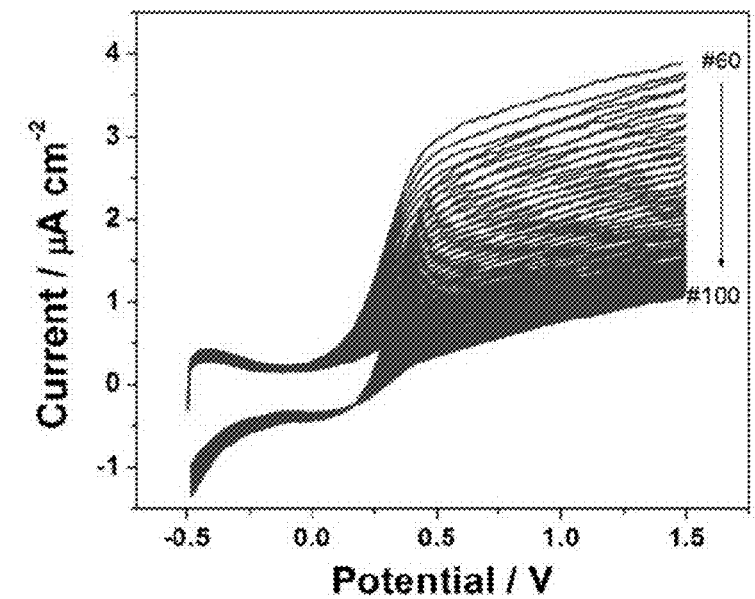

FIG. 11(a) shows the etching dynamics during consecutive potential cycling, where on each cycle the electrode potential was cycled up to the point just below the onset of the dark current associated with water oxidation. For the first 10 cycles, the voltammograms are nearly identical, and show a superlinear dependence of current on potential. On subsequent cycles, the voltammograms change shape: the PEC etching current increases at lower oxidation potentials and decreases at higher oxidation potentials (see traces #1, #12, and #16). After many cycles, as shown in FIG. 11(b), the voltammograms become S-shaped, with the amplitude of the current at higher oxidation potentials continuing to decrease with continued cycling, initially rapidly, and then more slowly.

These changes can be largely attributed to the decrease in volume as the film etches, and thus to a decrease in the total photoexcitation rate (per unit area illuminated and through the thickness of the film). However, as the film is etching, its morphology is also changing: first roughening and then ultimately evolving into very small, ~2 to 5 nm scale nanoparticles (see FIG. 13, discussed below). These nanoparticles are in the quantum size regime, leading to increasing bandgaps when their diameters are further decreased.

The manner in which this roughening and eventual nanoparticle formation influences the PEC etch currents is illustrated in FIGS. 12(a) and 12(b), which plots the PEC etch current as a function of time at a constant potential of 0.9 V and for various starting film thicknesses, respectively. After an initial current transient due to non-Faradaic double-layer charging, for each laser intensity (FIG. 12(a)) and film thickness (FIG. 12(b)) the PEC etch current follows a characteristic pattern: first, an incubation period; second, a rise to a peak etch rate; and, third, a decay with a long tail.

The initial incubation period is likely due to two offsetting phenomena: as the film etches the total absorption rate through the film thickness (and, thus, carrier creation rate) decreases, causing the etch rate to decrease; but as the film roughens, the surface area increases which causes the etch rate to increase. Eventually the surface area effect becomes stronger and the etch rate increases until it reaches a peak at which the product of light absorption and surface area is maximum. Subsequently, total surface area no longer increases while the film volume continues to decrease, leading to the observed etch rate decrease. In addition, as the nanoparticles that are formed enter the quantum size regime, the bandgap of these nanoparticles increase, leading to an even more pronounced drop in light absorption and etch rate. This interpretation is consistent with a longer incubation time at lower laser intensities, assuming the morphology evolution is similar but just slower. It is also consistent with an incubation time that decreases with decreasing film thickness, since this would require a shorter time for the surface roughness to reach a peak (FIG. 12(b)). Quantum dots (quantum sized nanoparticles) are also created more quickly for thinner films.

Surface Nanostructuring from InGaN Thin Films

All of the etch curves show a current decay with a very long tail. This highlights a unique characteristic of semiconductor etching promoted by photoexcitation, unlike other chemical or electrochemical etching processes that continue until the etched material is completely removed, such as in metal stripping. In the PEC etch process of the present invention a high density of nanoparticles remain out to very long times.

Figure 13A:
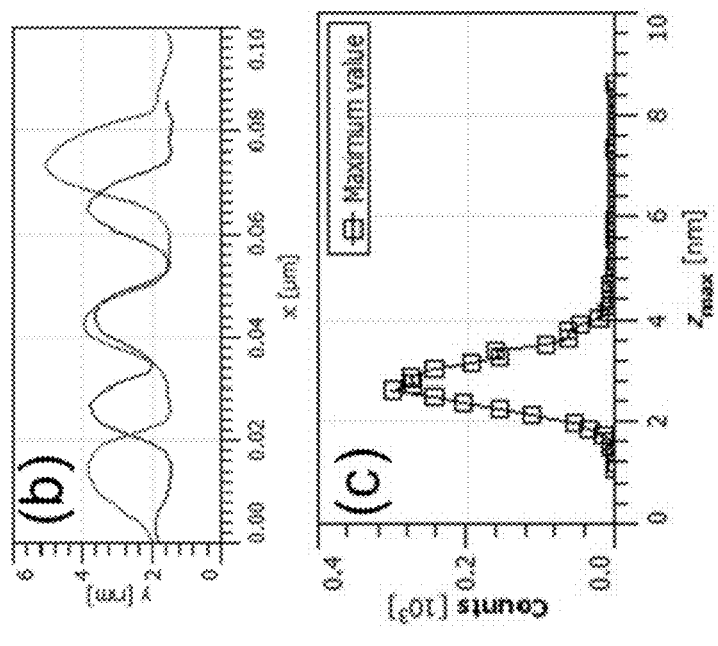
FIG. 13($a$) is an AFM analysis of InGaN nanoparticles formed after PEC etching of a 10 nm film by 100 potential cycles.
Figure 13B:
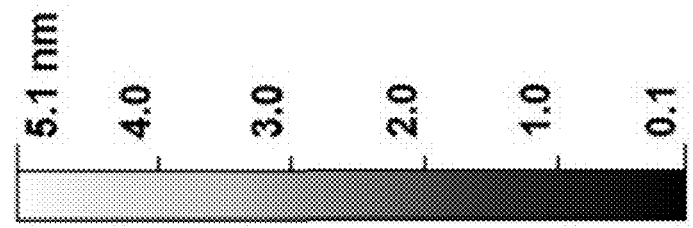
Figure 13C:
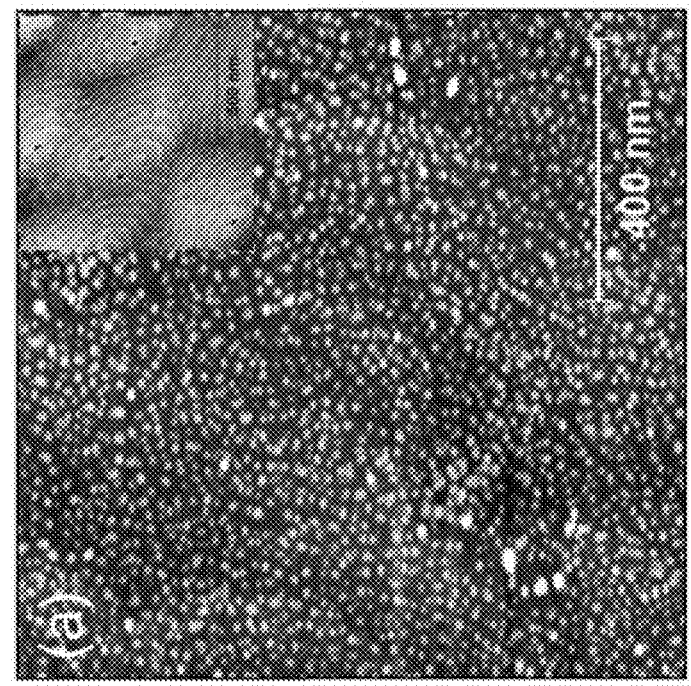

FIG. 13(a) shows an AFM image of the surface after etching for a long time. The initial film (FIG. 13(a), inset) is atomically smooth with visible step/terrace structures. Spiral growth with pin holes can be seen across most of the surface. The steps are primarily monoatomic; the terraces are often less than 100 nm in width, and the surface is rich in kinks and intersecting steps. After 100 consecutive potential cycles of etching (shown as in FIG. 11(b)), nanoparticles of relatively uniform size are formed on the surface (main portion of FIG. 13(a)). The height of the nanoparticles is around 2 to 3 nm, as seen in FIGS. 13(b) and 13(c).

Lateral PEC Etching

Figure 14:
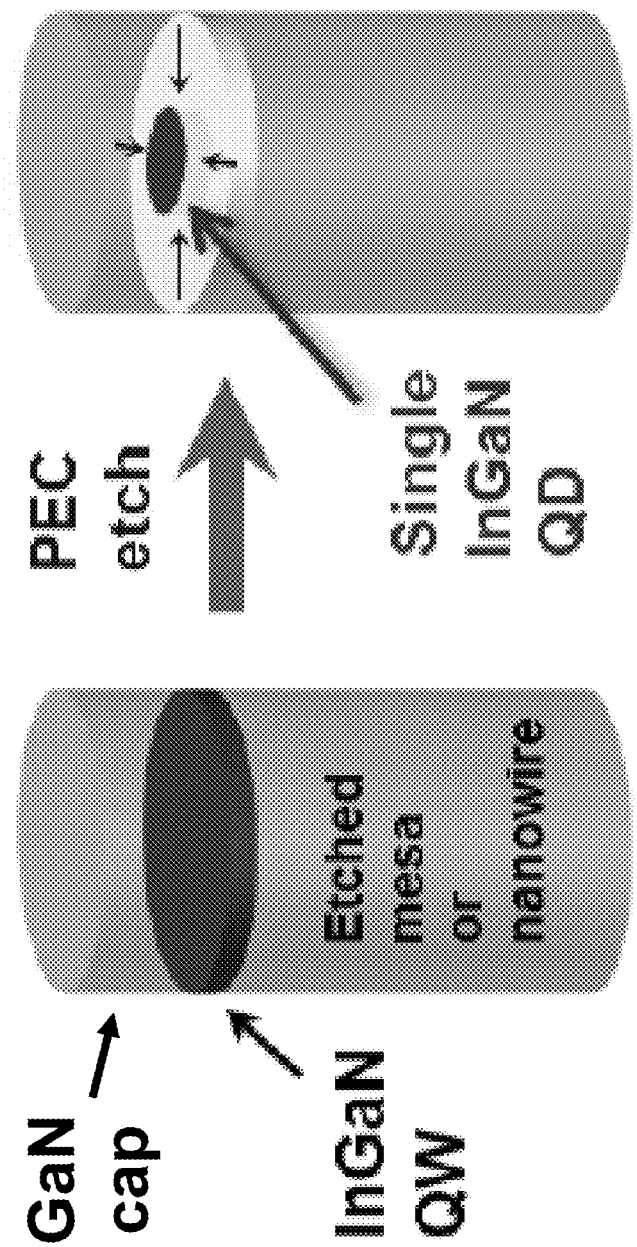
FIG. 14 is a schematic illustration of a method to laterally etch an InGaN quantum dot in an etched mesa or nanowire at a location determined by lithographic pre-patterning of the etched mesa or nanowire.

FIG. 14 is a schematic illustration of a method to laterally etch an InGaN quantum dot in an etched mesa or nanowire at a location pre-determined by lithography. In this illustration, an InGaN quantum well layer is sandwiched between two layers of material (e.g., GaN) having wider bandgap energies than the InGaN, therefore PEC etching occurs laterally inwards from the sides of the quantum well layer. Therefore, QSC-PEC etching can be used to fabricate both single and arrayed QDs within single or arrayed nanoposts or nanowires, thereby enabling simultaneous precise spatial and spectral matching of QDs to optical cavities within a nanophotonic structure.

As an example, PEC etching was used to laterally etch quantum well layers in an array of InGaN/GaN nanowires. The nanowires were fabricated using a top-down lithographic method, and contained 3-nm-thick InGaN quantum wells separated by 10 nm GaN layers. See G. T. Wang et al., *Nanotechnology* 17(23), 5773 (2006). The rest of the nanowires at both ends are thicker GaN layers, so PEC etching at wavelengths below the GaN bandgap can occur only laterally from the edges, as shown in FIG. 15(*a*) inset and FIG. 15(*b*). For these structures, because there is no film roughening, but instead the InGaN disks within the nanowires simply etch radially inwards, there is no incubation time. Instead, the current decreases exponentially with time as volume and associated photoexcitation rate decrease.

After lateral etching for 5 minutes, these quantum wells were etched laterally inwards by about 2 nm. However, the GaN barrier layers were also partially etched. The bottom faces of the quantum wells were etched deeper than the top portions, forming a horizontally asymmetric V-shape. Because the MOVPE-grown material is oriented with the N-face down, this image provides atomic resolution evidence of the preferential PEC etching of N-faces over the Ga-faces. See H. Bae et al., *Japanese Journal of Applied Physics* 52(8), (2013); and Y. Gao et al., *Applied Physics Letters* 84(17), 3322 (2004). After 15 minutes, the lateral etch-distance increases to ~30 to 40 nm, as shown in FIG. 15(*d*). Again, most of the GaN layers were affected at the N-faces, while the top Ga-faces remained unetched. Because these nanowires were etched at 405 nm laser wavelength, which is close to the absorption band edge of GaN, the bandgap selection alone is insufficient to etch selectively etch only the InGaN.

The present invention has been described as a method for quantum-size-controlled photoelectrochemical etching of semiconductor nanostructures. It will be understood that the above description is merely illustrative of the applications of the principles of the present invention, the scope of which is to be determined by the claims viewed in light of the specification. Other variants and modifications of the invention will be apparent to those of skill in the art.

We claim:

1. A method to fabricate semiconductor nanostructures, comprising:
   providing a semiconductor in a photoelectrochemical cell;
   illuminating a surface of the semiconductor with narrowband light having energy exceeding the bandgap energy of the semiconductor; and
   photoelectrochemically etching the surface of the semiconductor until a nanostructure forms in the surface that has a quantum-size-dependent bandgap energy greater than the energy of the narrowband light.

2. The method of claim 1, wherein the semiconductor comprises an III-V semiconductor.

3. The method of claim 2, wherein the III-V semiconductor comprises (Ga, Al, In)—(P, As, Sb) alloy.

4. The method of claim 2, wherein the III-V semiconductor comprises an III-nitride semiconductor.

5. The method of claim 4, wherein the III-nitride semiconductor comprises InGaN.

6. The method of claim 1, wherein the narrowband light has a bandwidth of less than 5 nm.

7. The method of claim 1, wherein the semiconductor comprises an epitaxial semiconductor film deposited on a substrate having a wider bandgap energy than the bandgap energy of the epitaxial semiconductor film, whereby the photochemical etching occurs on the exposed top surface of the epitaxial semiconductor film.

8. The method of claim 1, wherein the semiconductor comprises a quantum well layer sandwiched between two layers of material having wider bandgap energies than the epitaxial semiconductor film, whereby the photoelectrochemical etching occurs laterally inwards from the sides of the quantum well layer.

9. The method of claim 8, wherein the thickness of quantum well layer is less than 10 nm.

10. The method of claim 1, further comprising patterning the surface of the semiconductor to provide one or more etched mesas or nanowires prior to the step of photoelectrochemically etching the surface of the semiconductor.

11. The method of claim 1, wherein the surface of the semiconductor comprises an array of top-down fabricated nanowires.

12. The method of claim 1, wherein the surface of the semiconductor comprises an array of bottom-up grown nanowires.

13. The method of claim 1, wherein the surface of the semiconductor comprises one or more epitaxially grown quantum dots.

14. The method of claim 1, wherein the surface of the semiconductor comprises on or more colloidal quantum dots.

15. The method of claim 1, wherein the nanostructure is formed at a predetermined location on the surface.

16. The method of claim 1, wherein the electrolyte of the photoelectrochemical cell comprises a base.

17. The method of claim 16, wherein the base comprises potassium hydroxide.

18. The method of claim 1, wherein the electrolyte of the photoelectrochemical cell comprises an acid.

19. The method of claim 18, wherein the acid comprises sulfuric acid.

20. The method of claim 1, wherein the semiconductor is biased at a potential greater than 0.1 V during the photoelectrochemical etching.

* * * * *